US005693916A

United States Patent [19]

von Sprecken

[11] Patent Number: 5,693,916

[45] Date of Patent: Dec. 2, 1997

[54] METHOD FOR DESIGNING LOUD SPEAKER ENCLOSURES

[76] Inventor: Richard F. von Sprecken, P. O. Box 1315, Clinton, Miss. 39060

[21] Appl. No.: 635,239

[22] Filed: Apr. 12, 1996

Related U.S. Application Data

[63] Continuation of Ser. No. 269,434, Jun. 30, 1994, abandoned.

[51] Int. Cl.[6] .......... H05K 5/00

[52] U.S. Cl. .......... 181/156; 181/199

[58] Field of Search .......... 181/148, 151, 181/156, 199

[56] References Cited

U.S. PATENT DOCUMENTS

| | | | |
|---|---|---|---|
| 3,037,081 | 5/1962 | Carlsson . | |
| 3,688,864 | 9/1972 | Guss . | |
| 3,952,159 | 4/1976 | Schott . | |
| 4,135,600 | 1/1979 | Ogi et al. . | |
| 4,146,744 | 3/1979 | Veranth . | |
| 4,146,745 | 3/1979 | Froeschle . | |
| 4,201,274 | 5/1980 | Carlton | 181/156 |
| 4,231,445 | 11/1980 | Johnson . | |
| 4,284,166 | 8/1981 | Gale . | |
| 4,410,064 | 10/1983 | Taddeo . | |
| 4,549,631 | 10/1985 | Bose . | |
| 4,837,837 | 6/1989 | Taddeo . | |
| 4,875,546 | 10/1989 | Krnan . | |
| 4,933,982 | 6/1990 | Tanaka . | |
| 4,997,057 | 3/1991 | Furakawa . | |
| 5,012,889 | 5/1991 | Rodgers . | |
| 5,012,890 | 5/1991 | Nagi et al. . | |
| 5,025,885 | 6/1991 | Froeschle . | |
| 5,109,422 | 4/1992 | Furakawa . | |
| 5,115,473 | 5/1992 | Yamagishi et al. . | |
| 5,173,575 | 12/1992 | Furukawa . | |
| 5,189,706 | 2/1993 | Saeki . | |

*Primary Examiner*—Khanh Dang
*Attorney, Agent, or Firm*—Waddey & Patterson; Edward D. Lanquist, Jr.

[57] ABSTRACT

The present invention discloses a method of constructing a loud speaker system and a loud speaker enclosure itself that is ducted. Based upon a selected speaker base which is needed, the ideal duct diameter is determined to ensure maximum low frequency or bass, and punch, from the cabinet. Using the ideal duct diameter, the actual duct diameter is then determined. Based upon the ideal duct diameter, the speaker, and the desired cabinet depth, the cabinet height and width dimensions are determined. The length of the actual duct is then determined.

4 Claims, 3 Drawing Sheets

METHOD FOR DESIGNING LOUD SPEAKER ENCLOSURES

This application is a continuation of application Ser. No. 08/269,434 filed Jun. 30, 1994, now abandoned.

BACKGROUND OF THE INVENTION

The present invention relates generally to audio projectors and more specifically to the design and manufacture of loud speaker systems having ducts.

It will be appreciated by those skilled in the art that some type of loud speaker is usually used to transmit sound. However, in the past, to obtain effective, quality, and large sound, loud speaker systems have been very large. Therefore, many users have desired that the size of the loud speaker systems be reduced. One way to reduce the size of a loud speaker system is to use a duct. However, in the past, the duct size has been determined by complex calculations using complex parameters.

What is needed, then, is a method for constructing loud speaker systems which take advantage of a proper duct design based only upon one, easily obtained physical parameter of the loud speaker.

What is needed, then, is an easy and effective method of determining the appropriate duct dimensions and a method of designing the appropriate duct for a loud speaker system. This needed method and device must not be dependent upon the overall cabinet volume. This needed device and product must be capable of keeping the duct internal to the cabinet. This needed device must not use electrical parameters but instead use the audio parameters. This needed method and device must tune the system for increased punch at low frequencies as well as intermediate frequencies and achieve benefits at intermediate frequencies. This needed method and device must not require active equalization. This needed method and device is presently lacking in the prior art.

SUMMARY OF THE INVENTION

The present invention discloses a method of constructing a loud speaker enclosure and a loud speaker system itself. Based upon a selected speaker base which is needed, the ideal duct diameter is determined to ensure maximum low frequency or bass, and punch, for the desired cabinet size. Using the ideal duct diameter, the actual duct diameter is then determined. Based upon the actual duct diameter and the loud speaker's diameter, the cabinet dimensions are determined. The length of the actual duct is then determined.

Accordingly, one object of the present invention is to provide a method for constructing loud speaker enclosures and a loud speaker system which takes advantage of a proper duct design.

Another object of the present invention is to provide a method of determining the appropriate duct and a method of designing the appropriate duct for a loud speaker system.

Still a further object of the present invention is to provide a method and device which is not dependent upon the overall cabinet volume.

Still a further object of the present invention is to provide a device and product which must be capable of keeping the duct internal to the cabinet.

A still further object of the present invention is to provide a device which must not use electrical parameters but instead use one physical parameter.

Still another object of the present invention is to provide a method and device which can tune the system for increased punch at low frequencies as well as intermediate frequencies and achieve benefits at intermediate frequencies.

A further object of the present invention is to provide a method and device which does not require active equalization.

DESCRIPTION OF THE PREFERRED EMBODIMENT

Figure 1:
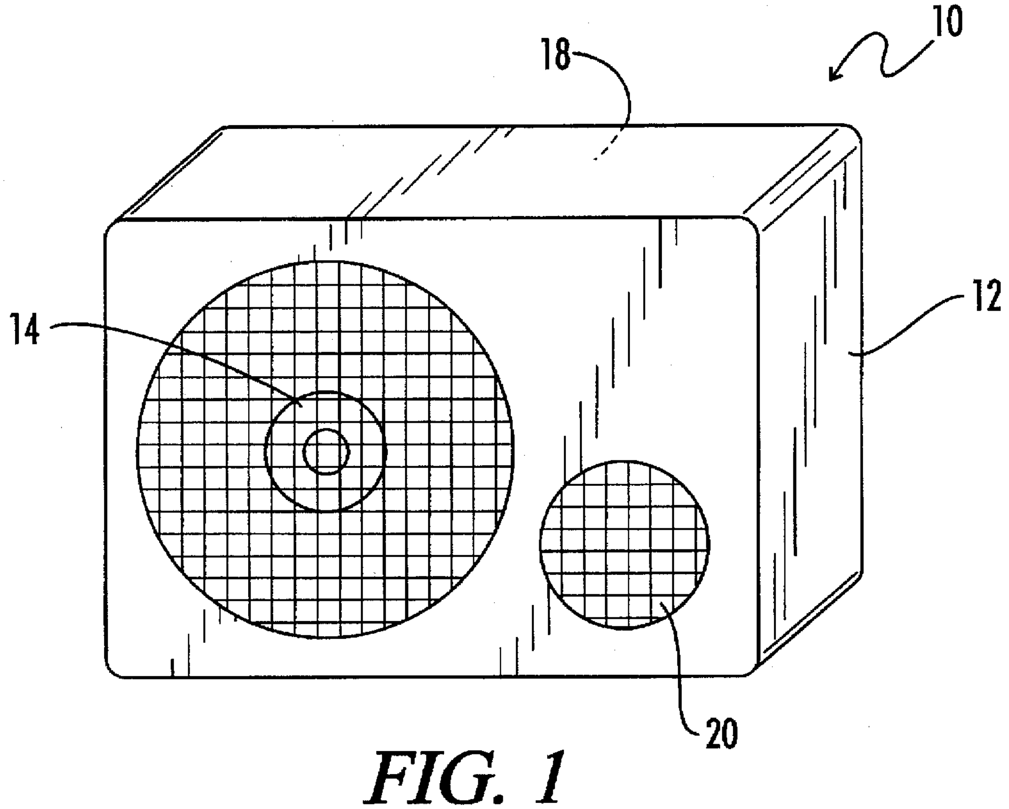
FIGS. 1 and 2 are perspective views of one embodiment of the device of the present invention.
Figure 2:
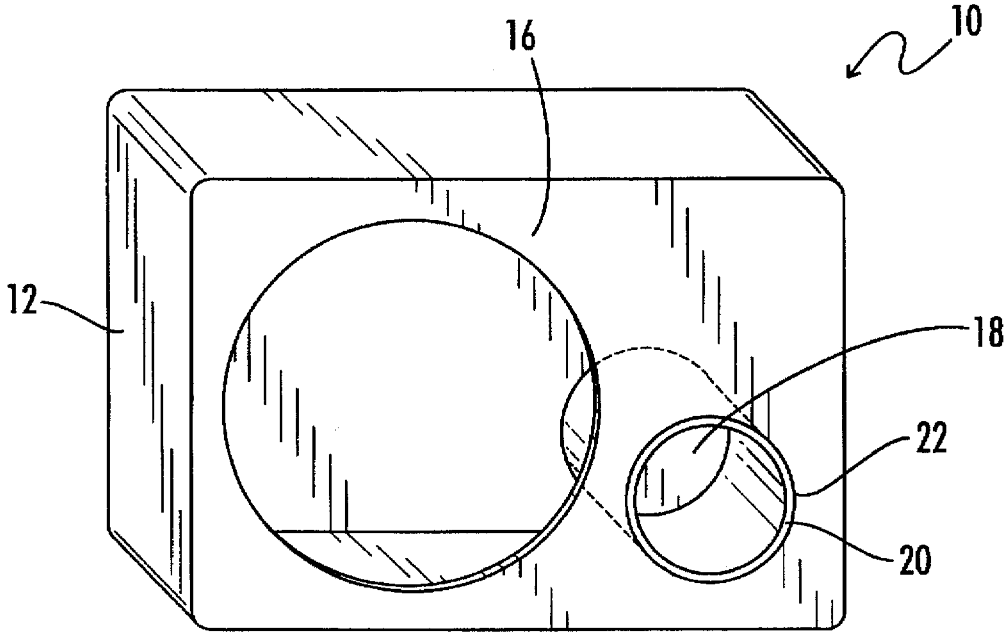

Referring now to FIGS. 1 and 2 there is shown generally at 10 the loud speaker system of the present invention. Loud speaker system 10 has enclosure 12 which contains speaker 14, speaker baffle 16, sound board 18, and duct 20. Duct 20 is supported by speaker baffle 16. Enclosure 12 is a housing which contains the other portions of a loud speaker. On front side 13 of enclosure 12 there is placed baffle 16. Opposite baffle 16 there is placed sound board 18 on bask side 17 of enclosure 12. The layout of enclosure 12 and its relationship with sound board 18 and speaker baffle 16 is also shown in FIG. 4.

Figure 3:
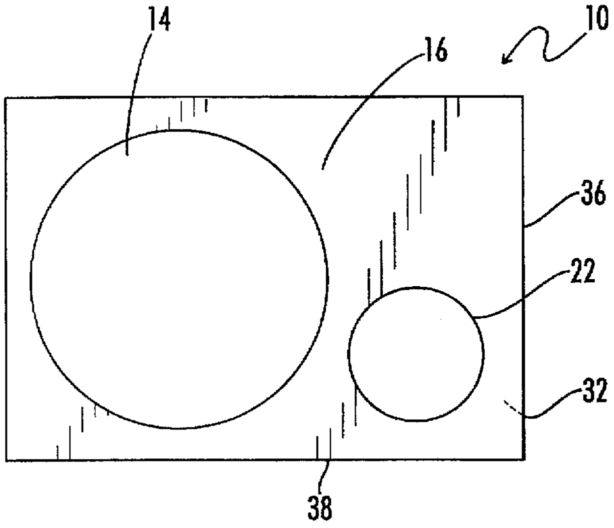
FIG. 3 is a front view of another embodiment of the device of the present invention.
Figure 4:
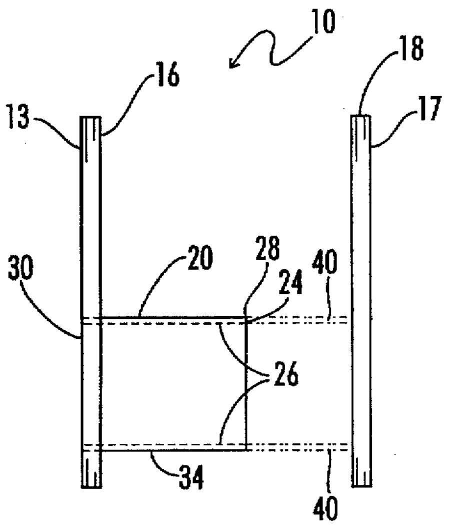
FIG. 4 is a side view of the embodiment of the device of the present invention shown in FIG. 3.

Referring to FIGS. 3 and 4 there is shown the simplest version of loud speaker system 10. As can be seen, speaker baffle 16 is designed to house speaker 14 of a desired diameter. Similarly, speaker baffle 16 supports duct 20 of a given size which will be determined as discussed below.

Referring again to FIGS. 3 and 4, an individual desiring to manufacture a duct of the proper dimensions will first select a desired speaker size. Speakers come in diameters of ten inch, twelve inch, fifteen inch, eighteen inch, and others. Using the speaker size, the size of speaker baffle 16 is designed so that speaker baffle 16 can house speaker 14. Each speaker 14 comes with certain speaker manufacturer specifications including peak displacement volume ($V_d$). If the $V_d$ is not available on the speaker specifications itself, one can contact the speaker manufacturer. For example, for a fifteen inch speaker, its value is typically 17.2 cubic inches. However, $V_d$ can vary from speaker to speaker. The next step is to determine the ideal port area ($P_{idl.a.}$). $P_{idl.a.}$ is determined by dividing $V_d$ by the speaker baffle thickness ($B_t$). In other words, one would need to measure thickness of baffle 16 and divide that into $V_d$. Therefore, the formula is as follows:

$$P_{idl.a.}=(V_d)/(B_t)$$

Using the standard mathematical equations for the area of a circle, the ideal port radius ($P_{idl.r.}$) is determined as follows:

$$P_{idl.r.}=[(P_{idl.a.})/(pi)]^{1/2}$$

The ideal port radius is then multiplied by two to obtain the ideal port diameter as follows:

$$P_{idl.d.}=(P_{idl.r.})(2)$$

Practical tooling considerations, such as the size of hole saw that is available and the availability of ducts with certain diameters, can determine what size port diameter is actually used. The total mouth area of the actual duct should be equal to or less than, but as close to as possible, the ideal duct mouth area. Also in practice though, the thickness of the duct wall must be taken into consideration for determining what size hole saw is to be used to cut duct hole 22. It is the inside diameter 26 of duct 20 that is important in these calculations. The larger the inside diameter of the duct, the longer the duct can be, and therefore, the lower the frequency that can be passed. The available area of the speaker baffle will also be a determining factor for choosing the actual duct size because, of course, both the speaker and the duct have to fit on speaker baffle 16. In the simplest case, rear 28 of duct 20 will be the same diameter of front 30 of duct 20 because ducts 20 are generally cylindrical in shape.

The next step is to calculate the actual inside circumference ($D_{act.ins.c.}$) of duct 20 by using the following standard mathematical equation:

$$D_{act.ins.c.}=(pi)(D_{act.ins.d.})$$

The next step is to determine the percentage of the length of circumference that is adjacent to the volume around duct 20 where there is no air movement ($D_{act.ins.c.l.n.p.}$) which is the actual inside circumference length non-usable percentage. No air movement in this volume will be due ordinarily to the volume that is filled with insulation. Typically, this percentage will be 25% to 50% of the circumference, depending upon the thickness of insulation 32 or the location of duct 20. For example, if outside walls 34 are a distance of one inch from side 36 and lower 38 enclosure panels, and if one inch thick insulation 32 is used, then the percentage of air where there is no movement is 25%; that is, over 25% of the circumference area there is insulation resting along the length of duct 20. Based upon this calculation, the actual length of circumference of the duct that correlates to actual air movement ($D_{act.ins.c.l.u.}$) (duct's actual inside circumference length usable) is calculated based upon subtracting the non-usable circumference as follows:

$$D_{act.ins.c.l.u.}=(D_{act.ins.c})-(D_{act.ins.c.})(D_{act.ins.c.l.n.p})$$

One would then project duct 20 on a plane until it reaches baffle 16 to create imaginary duct 40. This imaginary duct 40 should have a mouth area equal to the mouth area of the ideal duct; and if two ducts are used, then each imaginary duct 40 should have a mouth area equal to one-half of the ideal duct mouth area. Please note that ideal duct mouth area ($D_{idl.a.}$) equals ideal total port mouth area ($P_{idl.a.}$). Using the mathematical formula for the area of a cylinder, the length of imaginary duct is calculated by dividing the ideal mouth area that is required of the imaginary duct by the usable circumference. The result will be the length required of imaginary duct as follows:

$$D_{img.l.}=(D_{idl.a})/(D_{act.ins.c.l.u.})$$

The length of the imaginary duct is then subtracted from the depth of the inside enclosure ($E_{ins.d}$). This will give the length of the actual duct inside the enclosure and not including the speaker baffle thickness as follows:

$$D_{act.ins.l.}=(E_{ins.d.})-(D_{img.l.})$$

The speaker baffle thickness is then added to the inside duct length to obtain the total length of duct ($D_{act.t.l.}$) as follows:

$$D_{act.t.l.}=(D_{act.ins.l.})+B_t$$

Referring again to FIGS. 3 and 4, the user would first determine the speaker's peak displacement volume. In this particular instance, a speaker having a fifteen inch diameter is used. Assuming that a fifteen inch speaker is used, $V_d$ is equal to 17.2 cubic inches. $V_d$ is then divided by speaker baffle thickness which is, in this case, three-quarters inch to achieve ideal port area ($P_{ial.a.}$) which is, in this case, 22.93 square inches. The ideal port radius is then determined by dividing the ideal port area by (pi) and taking the square root, which therefore, in this case, $P_{idl.r.}$ is 2.7 inches. The ideal port radius is then multiplied by two to obtain the ideal port diameter. In this case, $P_{idl.d.}$ is equal to 5.4 inches. Assuming that one has the capability of cutting a duct diameter of 5.5 inches, the actual inside circumference is determined by taking the actual inside diameter which is 5.25 inches and multiplying it by (pi), which will give us a duct actual inside circumference of 16.49 inches. Assuming, as in this case, that duct 20 borders 3-inch insulation 32 on side and lower panels 36, 38 with 50% of the circumference being unusable, the duct's actual inside circumference length unusable portion is determined. Using this, the duct's actual inside circumference length usable is determined by taking the actual inside circumference length and subtracting from it the actual inside circumference length multiplied by the percentage of unusable circumference length. Therefore, the actual inside circumference length usable is 8.25 inches. Using the mathematical formula for the area of a cylinder, the length of the imaginary duct is determined by dividing the mouth area of the ideal duct by the usable inside circumference of the actual duct which will provide us with the length of the imaginary duct (2.78 inches). The length of the imaginary duct is subtracted from the inside depth of the enclosure which is 9.125 inches. Therefore, the length of the actual duct is determined by adding the length of the duct that is inside the enclosure to the baffle thickness. Therefore, one can design the actual baffle size using the diameter of the duct and the speaker diameter and can design total length of the actual duct.

Figure 5:
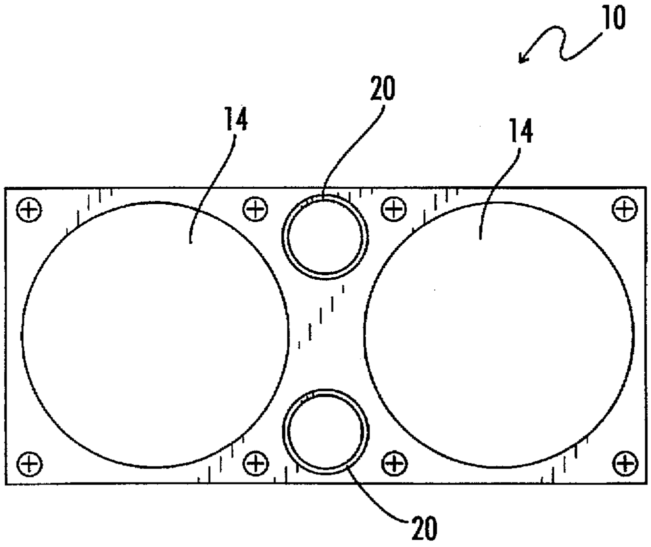
FIG. 5 is a front view of still another embodiment of the device of the present invention.
Figure 6:
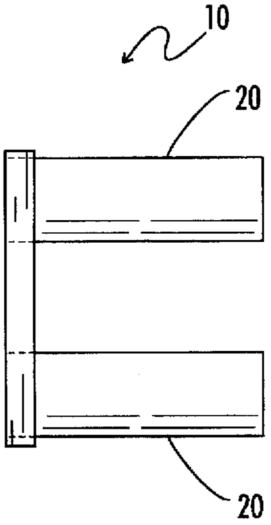
FIG. 6 is a side view of the embodiment of the device of the present invention shown in FIG. 5.

Referring now to FIGS. 5 and 6, there is shown generally at 10 another embodiment of the loud speaker system of the present invention. In this particular system, speakers 14 are provided as well as ducts 20. To determine the ideal duct size, the peak displacement volumes of the speakers is added together. This is divided by the speaker baffle thickness to get the ideal port area. In this particular instance, the peak displacement volume for speakers having a diameter of 10 inches as manufactured by ELECTROVOICE® (FORCE 10®) is 6.4 cubic inches. Therefore, the total ideal port area for two ten inch speakers is, assuming a baffle thickness of three-quarters inch, is 17.06 square inches. Because we are using two ducts, the total ideal port area is divided by two, to give the ideal port area for each duct. Then using the system above, the ideal duct length and diameter is determined.

Figure 7:
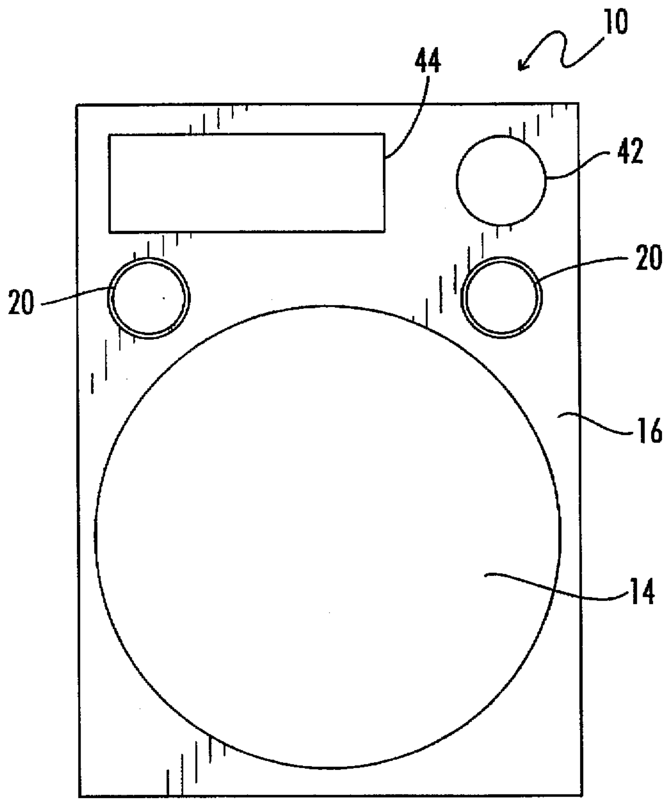
FIG. 7 is a front view of still another embodiment of the device of the present invention.
Figure 8:
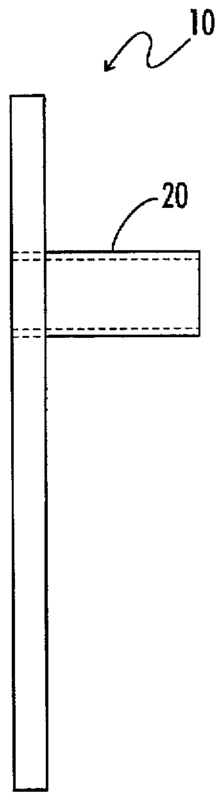
FIG. 8 is a side view of the embodiment of the device of the present invention shown in FIG. 7.

Referring now to FIGS. 7 and 8, there is shown generally at 10 still another embodiment of the loud speaker system of the present invention. In this particular instance, speaker baffle 16 houses speaker 14 as well as ducts 20, horns 42, 44. The horns and cutouts 42, 44, do not affect the duct size. Therefore, using the method described above, the ideal duct diameter and the actual size are determined in the same way. Thus, although there have been described particular embodiments of the present invention of a new and useful method for designing loud speaker enclosures, it is not intended that such references be construed as limitations upon the scope of this invention except as set forth in the following claims. Further, although there have been described certain dimensions used in the preferred embodiment, it is not intended that such dimensions be construed as limitations upon the scope of this invention except as set forth in the following claims.

What I claim is:

1. A method for constructing a loud speaker system having an enclosure, a speaker, and a duct, said enclosure having a front side and a back side, a baffle having a given thickness is placed on said front side of said enclosure and a sound board is placed on said back side of said enclosure, wherein said speaker has a peak displacement volume, said method comprising the steps of:

a. cutting a hole in said speaker baffle, said hole having a hole diameter having an actual port diameter approximating an ideal port diameter wherein the ideal port diameter is defined as two times the square root of said peak displacement volume divided by Pi and said given thickness of said baffle; and b. attaching said duct having a cylindrical shape to said speaker baffle inside said hole and said duct having an outside diameter equal to said hole diameter and an inside diameter and a specific length.

2. A method for making a loud speaker having an enclosure housing a speaker and a duct, a speaker, and a duct, said enclosure having a front side and a back side, a baffle having a given thickness is placed on said front side of said enclosure and a sound board is placed on said back side of said enclosure, said speaker having a peak displacement volume and said speaker attached to said speaker baffle, said method comprising the steps of:

a. measuring said baffle thickness;

b. creating a hole having a hole diameter in said speaker baffle, said hole diameter approximating an ideal port diameter wherein said ideal port diameter is defined as two times the square root of said peak displacement volume divided by Pi and said given thickness of said baffle; and c. attaching said duct having a cylindrical shape to said speaker baffle at said hole.

3. The method of claim 2 wherein;

a. said enclosure having a depth between said front side and said back side; and b. said duct having an inside circumference, a portion of said duct is in contact with said enclosure or insulation attached to said enclosure referred to as a non-usable circumference, said duct having a usable circumference equal to said inside circumference minus said non-usable circumference, said duct having an ideal port area of Pi multiplied by one-fourth of said ideal port diameter squared, said duct having an ideal duct length equal to said ideal port area divided by said usable circumference;

c. said duct having a length equal to said thickness of said baffle added to said depth between said front side and said back side minus said ideal duct length; and d. further comprising the step of making said duct prior to attachment of a given length based upon the mount of said duct in contact with said enclosure.

4. A method for constructing a loud speaker system having an enclosure, a speaker, and a duct, said enclosure having a front side and a back side, a baffle having a given thickness is placed on said front side of said enclosure and a sound board is placed on said back side of said enclosure, wherein said speaker has a peak displacement volume, said method comprising the steps of:

a. cutting a hole in said speaker baffle, said hole having a hole diameter having an actual port diameter approximating an ideal port diameter wherein the ideal port diameter is defined as two times the square root of said peak displacement volume divided by Pi and said given thickness of said baffle;

b. attaching said duct having a cylindrical shape to said speaker baffle inside said hole and said duct having an outside diameter equal to said hole diameter and an inside diameter and a specific length;

c. said enclosure having a depth between said front side and said back side;

d. said duct having an inside circumference, a portion of said duct is in contact with said enclosure or insulation attached to said enclosure referred to as a non-usable circumference, said duct having a usable circumference equal to said inside circumference minus said non-usable circumference, said duct having an ideal port area of Pi multiplied by one-fourth of said ideal port diameter squared, said duct having an ideal duct length equal to said ideal port area divided by said usable circumference;

e. said duct having a length equal to said thickness of said baffle added to said depth between said front side and said back side minus said ideal duct length; and f. further comprising the step of making said duct prior to attachment of a given length based upon the amount of said duct in contact with said enclosure.

* * * * *